(12) United States Patent
Asano

(10) Patent No.: US 7,893,769 B2
(45) Date of Patent: Feb. 22, 2011

(54) POWER AMPLIFIER, METHOD FOR CONTROLLING POWER AMPLIFIER, AND WIRELESS COMMUNICATION APPARATUS

(75) Inventor: Hiroyuki Asano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/483,907

(22) Filed: Jun. 12, 2009

(65) Prior Publication Data

US 2010/0066445 A1 Mar. 18, 2010

(30) Foreign Application Priority Data

Sep. 18, 2008 (JP) ............................. 2008-239829

(51) Int. Cl.
*H03G 3/30* (2006.01)
*H03F 3/04* (2006.01)

(52) U.S. Cl. ...................... 330/285; 330/302; 330/310

(58) Field of Classification Search ............... 330/98, 330/133, 285, 296, 302, 310
See application file for complete search history.

(56) References Cited

U.S. PATENT DOCUMENTS

| | | | |
|---|---|---|---|
| 5,889,434 A | 3/1999 | Shimura et al. | |
| 6,492,869 B1 | 12/2002 | Kuriyama | |
| 6,771,130 B2* | 8/2004 | Hasegawa et al. | 330/302 |
| 7,573,336 B2* | 8/2009 | Ishimaru et al. | 330/310 |
| 2002/0033735 A1 | 3/2002 | Hasegawa et al. | |
| 2002/0039047 A1 | 4/2002 | Suzuki | |
| 2007/0024370 A1 | 2/2007 | Hirata et al. | |
| 2007/0164824 A1 | 7/2007 | Aoki | |

FOREIGN PATENT DOCUMENTS

| | | |
|---|---|---|
| JP | 10-135750 A | 5/1998 |
| JP | 2001-102873 A | 4/2001 |
| JP | 2002-84144 A | 3/2002 |
| JP | 2002-111400 A | 4/2002 |
| JP | 2002-171145 A | 6/2002 |
| JP | 2003-324325 A | 11/2003 |
| JP | 2007-36973 A | 2/2007 |
| WO | WO 2005/067139 A1 | 7/2005 |

* cited by examiner

*Primary Examiner*—Khanh V Nguyen
(74) *Attorney, Agent, or Firm*—Birch, Stewart, Kolasch and Birch, LLP

(57) ABSTRACT

A power amplifier includes: a distortion compensating circuit that causes a bias circuit to have an output impedance so that a subsequent block bipolar transistor for signal amplification-use has a maximized saturated output power; and a distortion compensating circuit that causes a bias circuit to have an output impedance so that a distortion of an output power of the power amplifier 1 with respect to an input power is canceled by a distortion characteristic of an output power with respect to an input power of the subsequent block bipolar transistor for signal amplification-use which has a maximized saturated output power and a distortion characteristic of an output power with respect to an input power of the preceding block bipolar transistor for signal amplification-use. This makes it possible to provide a power amplifier that allows reduction in saturated output power brought by realization of a highly efficient low-distortion power amplifier.

14 Claims, 11 Drawing Sheets

F I G. 1
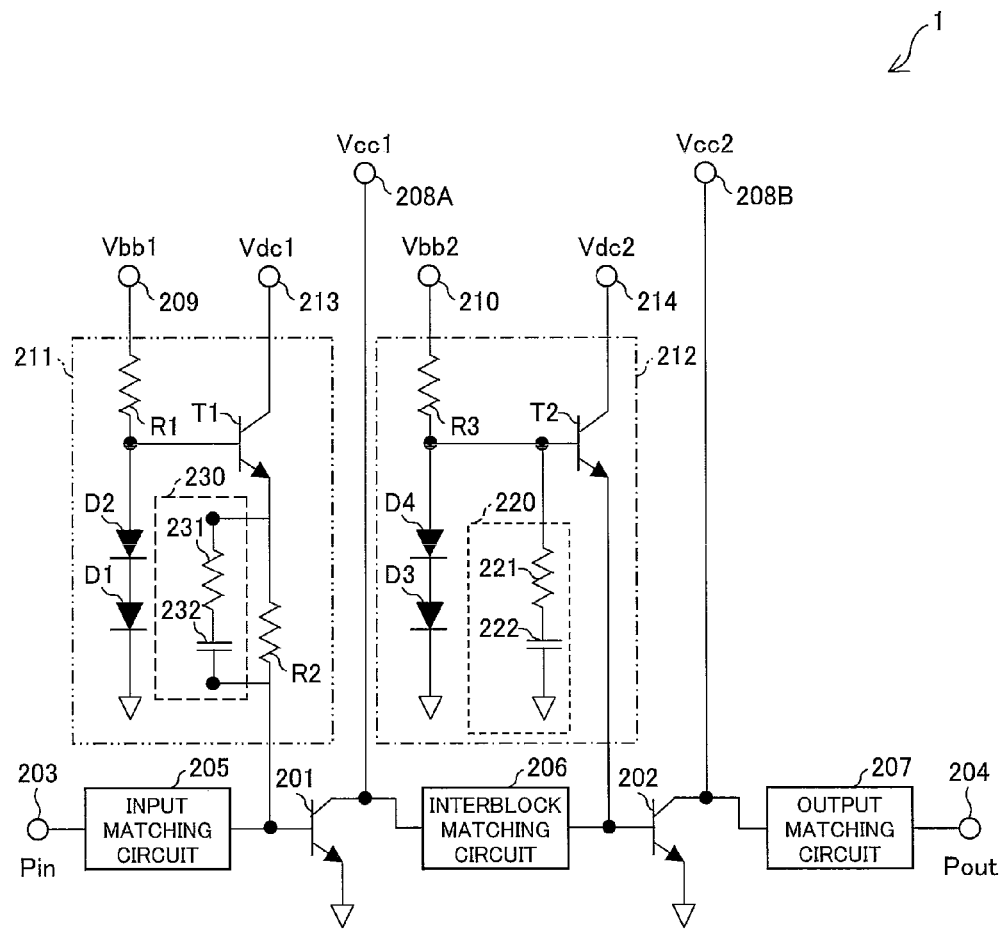

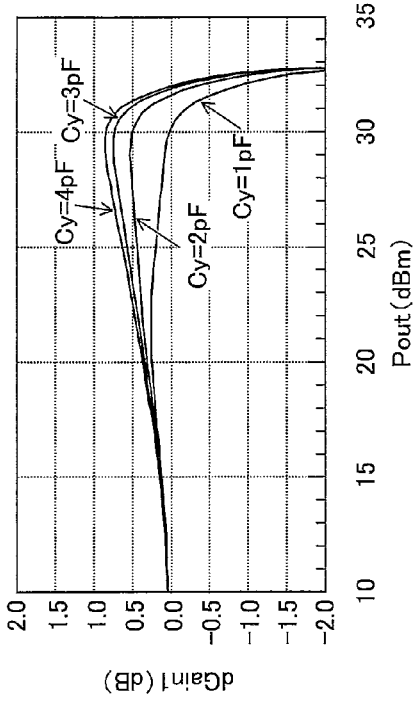
F I G. 2 (c)
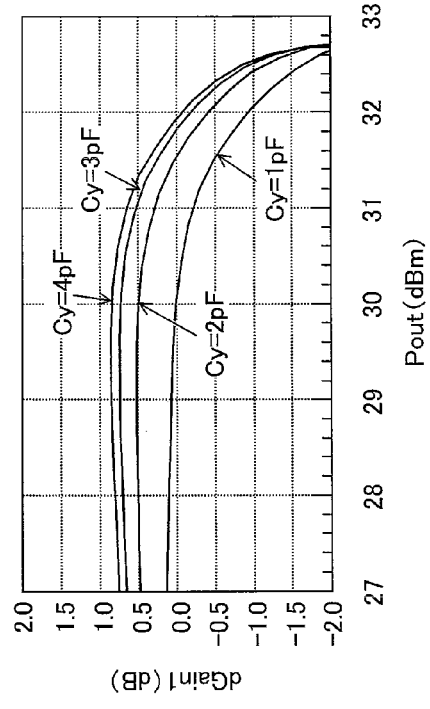
F I G. 2 (d)
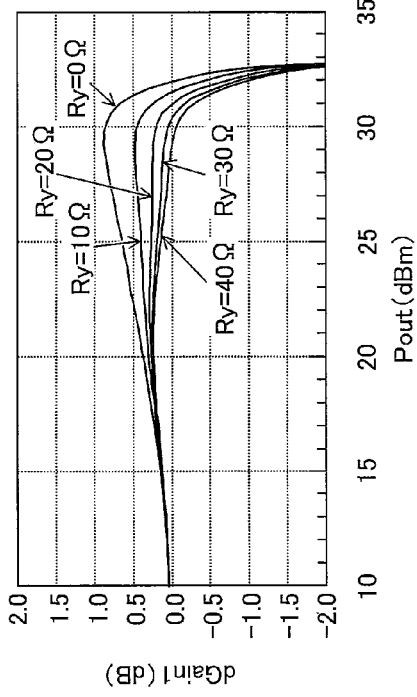
F I G. 2 (a)
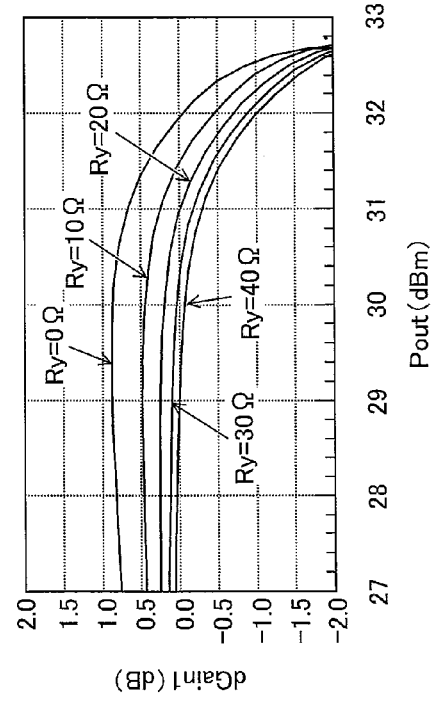
F I G. 2 (b)

F I G. 4
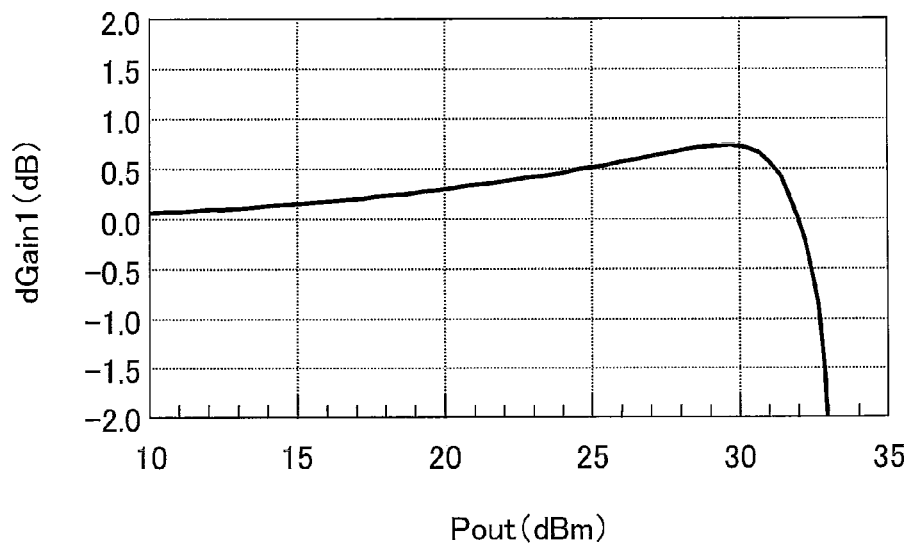
F I G. 5
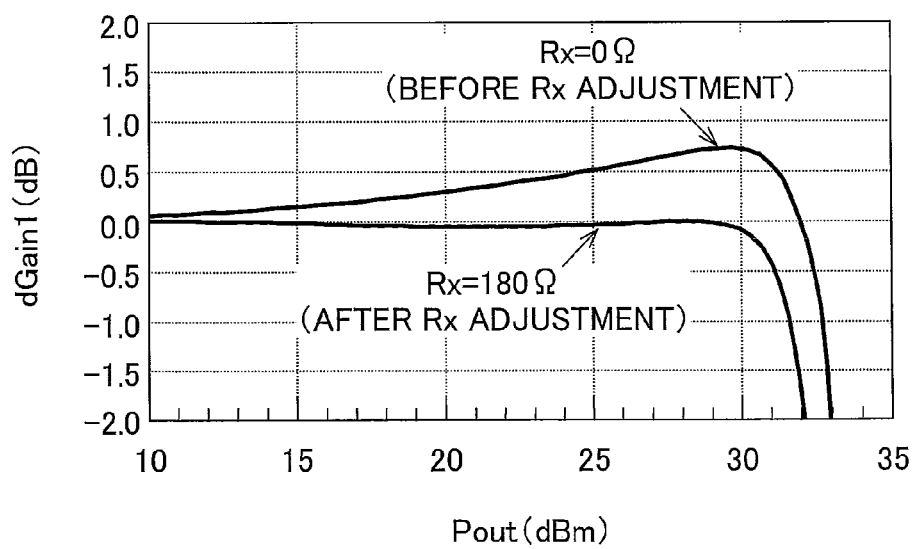

POWER AMPLIFIER, METHOD FOR CONTROLLING POWER AMPLIFIER, AND WIRELESS COMMUNICATION APPARATUS

This Nonprovisional application claims priority under 35 U.S.C. §119(a) on Patent Application No. 2008-239829 filed in Japan on Sep. 18, 2008, the entire contents of which are hereby incorporated by reference.

TECHNICAL FIELD

The present invention relates to (i) a power amplifier that efficiently amplifies a modulated wave of a digital signal, while keeping distortion low, in a wireless communication apparatus such as a mobile terminal, (ii) a method for controlling the power amplifier, and (iii) a wireless communication apparatus.

BACKGROUND ART

For example, a power amplifier used in a wireless communication apparatus, such as a mobile terminal, on a transmitting side handles signals (i.e., modulated waves of digital signals) that have been subjected to digital modulation such as amplitude modulation or phase modulation. As such, the power amplifier requires improvement in linearity of an output signal, i.e., a reduction in distortion.

In addition, the power amplifier requires a reduction in power consumption, i.e., high-efficiency of power amplification in order that the life of a battery provided in the wireless communication apparatus can be prolonged.

A reduction in distortion of a power amplifier can be achieved through Class A operation of a transistor of an output block in the power amplifier.

However, a wireless communication apparatus including a Class A power amplifier has a larger electric current, while receiving no signal (so-called idle current), than a wireless communication apparatus having a Class B power amplifier.

Therefore, a wireless communication apparatus having a Class A power amplifier consumes a large amount of power, thereby having a difficulty in achieving low power consumption.

For this reason, an art is dominantly adopted in which a power amplifier of a wireless communication apparatus allows a transistor of its output block to carry out Class A operation and Class B operation, i.e., the transistor of the output block to carry out Class AB operation so that the low power consumption is achieved.

In general, a gain of a Class A power amplifier can be maintained nearly constant until an output power comes close to a saturated output power of the power amplifier.

In contrast, generally, a gain of a Class AB power amplifier greatly fluctuates depending on an increase in output power. This greatly impairs linearity of the Class AB power amplifier, in contrast to a Class A power amplifier.

In a case where power amplification of a digitally-modulated signal is carried out by a Class AB power amplifier having impaired linearity, a spectrum of an output power of the power amplifier becomes broad. This is not desirable since the output power having a broad spectrum serves as a disturbing wave with respect to a channel adjacent to a target channel.

In view of the circumstances, a conventional power amplifier is disclosed in Patent Literature 1 (Japanese Unexamined Patent Application Publication, Tokukai No. 2002-84144 A (Publication Date: Mar. 22, 2002)), as a power amplifier whose aim is to carry out highly efficient power amplification with low distortion.

The power amplifier disclosed in Patent Literature 1 adopts the art below in order to prevent impairment of linearity of a power amplifier in which the transistor of the output block performs Class AB operation.

FIG. 13 is a diagram illustrating a circuit configuration of the power amplifier disclosed in Patent Literature 1.

According to the power amplifier illustrated in FIG. 13, a distortion compensating circuit (regulator circuit) 21 in which a resistor 4 and a capacitor 5 are connected in series is connected, via a variable impedance element 2, to a base terminal of a bipolar transistor 102 (hereinafter, referred to as "transistor 102") for signal amplification-use which follows a bipolar transistor 101 (hereinafter, referred to as "transistor 101") for signal amplification-use.

Specifically, the base terminal of the transistor 102 is connected to one end of the variable impedance element 2. The other end of the variable impedance element 2 is connected to one end of the resistor 4. The other end of the resistor 4 is connected to one end of the capacitor 5. The other end of the capacitor 5 is grounded.

The power amplifier illustrated in FIG. 13 further includes a supply voltage terminal 1, a DC regulator element 22 having a resistor 3, the transistor 101, an input terminal 103, an output terminal 104, an input matching circuit 105, an inter-block matching circuit 106, an output matching circuit 107, two supply voltage terminals 108, and a supply voltage terminal 109.

In the power amplifier illustrated in FIG. 13, a base bias point of the transistor 101, which is not subjected to distortion compensation made by the distortion compensating circuit 21, is set to a base bias point of a transistor which carries out Class A operation or Class AB operation close to Class A operation.

On the other hand, in the power amplifier illustrated in FIG. 13, a base bias point of the transistor 102, which is subjected to distortion compensation made by the distortion compensating circuit 21, is set to a base bias point of a transistor which carries out Class B operation, or Class AB operation close to Class B operation.

The transistor 101 performs Class A operation or Class AB operation close to Class A operation. Therefore, the transistor 101 has a characteristic in which a gain is reduced when an input power increases close to a saturated output power of the transistor 101.

On the other hand, the transistor 102 performs Class B operation or Class AB operation close to Class B operation. Therefore, the transistor 102 has a characteristic in which a gain is increased when an input power increases close to the saturated output power of the transistor 102.

Thus, the transistors 101 and 102 exhibit nearly opposite distortion characteristics of output powers with respect to input powers, respectively. This allows the power amplifier, as a whole, to cancel out distortions caused by the transistors 101 and 102.

As a result, the power amplifier disclosed in Patent Literature 1 allows an improvement in distortion characteristic of an output power with respect to an input power.

A degree, to which the distortions are cancelled out, can be adjusted through an adjustment of a resistance of the resistor 4 and/or a capacitance of the capacitor 5. The resistor 4 and the capacitor 5 are included in the distortion compensating circuit 21 which serves as a part of a bias circuit for the transistor 102. The bias circuit is a circuit for supplying a predetermined bias current (base bias point) to the base terminal of the transistor 102. The bias circuit is composed of the distortion compensating circuit 21, the variable impedance element 2, and the DC regulator element 22.

With the arrangement, Patent Literature 1 realizes a power amplifier that is low in power consumption and low in distortion (i.e., small in gain deviation with respect to an output power).

Unfortunately, the problem arises that it is likely to decrease the saturated output power of a power amplifier, in a case where the power amplifier is configured based on the disclosure of Patent Literature 1 so as to have a highly efficient low-distortion characteristic.

The below describes the problem, with reference to FIG. 13.

A saturated output power of the power amplifier illustrated in FIG. 13 depends on an output impedance of the bias circuit. Note that the output impedance is an output impedance of the bias circuit which is obtained when the bias circuit is viewed from the base terminal of the transistor 102, which serves as an output block.

In a case where an output impedance of the bias circuit is high, in general, a voltage drop occurs at the base terminal of the transistor 102 due to the output impedance when the base current increases in response to an increase in input power. The voltage drop causes a decrease in base voltage of the transistor 102. Accordingly, an output power of the transistor 102 decreases. As a result, a gain of the output block of the power amplifier decreases, thereby causing a decrease in saturated output power.

As such, it is preferable to minimize an output impedance of the bias circuit in order to prevent (i) a decrease in base voltage of the transistor 102 and (ii) a decrease in saturated output power of the power amplifier illustrated in FIG. 13.

An impedance Zb of the bias circuit of the power amplifier illustrated in FIG. 13 is expressed by the following equation (1):

$$Zb = Zc + Zd \quad (1)$$

where an impedance of the supply voltage terminal 1 is infinity; an impedance of the variable impedance element 2 is represented by Zd; and an impedance of the distortion compensating circuit 21 is represented by Zc.

The impedance Zc of the distortion compensating circuit 21 is equal to an impedance of a series circuit in which the resistor 4 having a resistance Rc and the capacitor 5 having a capacitance Cc are connected in series.

In order to minimize the impedance Zb of the bias circuit, it is necessary to minimize the impedance Zd of the variable impedance element 2, and to minimize the impedance Zc of the distortion compensating circuit 21. In order to minimize the impedance Zc of the distortion compensating circuit 21, ideally, the resistance Rc of the resistor 4 is set to 0 and the capacitance Cc of the capacitor 5 is set to infinity.

Note, however, that the power amplifier should cancel out the distortions caused by the transistors 101 and 102 so as to have a highly efficient low-distortion characteristic. On this account, the distortion compensating circuit 21 should be adjusted so that the resistance Rc of the resistor 4 and/or the capacitance Cc of the capacitor 5 to have specific optimum value(s).

Therefore, it is difficult to simultaneously optimize a saturated output power and an amplitude distortion.

SUMMARY OF INVENTION

The present invention is made in view of the problem. An object of the present invention is to provide a power amplifier that can reduce the possibility that the saturated output power is reduced due to the fact that the power amplifier should have a highly efficient low-distortion characteristic.

In order to attain the object, a power amplifier of the present invention includes: a plurality of amplifying blocks each of which includes a bipolar transistor, an output block bias circuit which is connected to a base terminal of an output block bipolar transistor, and which constitutes an output block of the plurality of amplifying blocks, a preceding block bias circuit which is connected to a base terminal of a preceding block bipolar transistor, and which constitutes an amplifying block followed by the output block, an output block distortion compensating circuit that causes the output block bias circuit to have a low output impedance so that the output block bipolar transistor has a maximized saturated output power, and a preceding block distortion compensating circuit that causes the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor.

In order to attain the object, a method of the present invention is a method for controlling a power amplifier, said power amplifier including: a plurality of amplifying blocks each of which includes a bipolar transistor, an output block bias circuit which is connected to a base terminal of an output block bipolar transistor, and which constitutes an output block of the plurality of amplifying blocks, and a preceding block bias circuit which is connected to a base terminal of a preceding block bipolar transistor, and which constitutes an amplifying block followed by the output block, said method including the steps of: causing the output block bias circuit to have a low output impedance so that the output block bipolar transistor has a maximized saturated output power; and causing the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor According to the arrangement, an output impedance of the output block bias circuit is set by the output block distortion compensating circuit to such a value that a saturated output power of the output block bipolar transistor of the output block is maximized, i.e., the output impedance is set to a sufficiently low value. This makes it possible to suppress a decrease in saturated output power of the output block bipolar transistor.

Thus, decrease in saturated output power of the power amplifier is suppressed. In addition, an output impedance of the preceding block bias circuit is adjusted. The output impedance of the preceding block bias circuit is set so that an operating voltage becomes such a voltage that a distortion of an output power of the whole power amplifier with respect to an input power is canceled out by utilizing an amplitude distortion characteristic of an output power of the output block bipolar transistor with respect to an input power and an amplitude distortion characteristic of the preceding block bipolar transistor. This makes it possible to realize a highly efficient low-distortion power amplifier as is the case with a power amplifier according to a conventional art, and suppression of a decrease in saturated output power of the highly efficient low-distortion power amplifier.

Additional objects, features, and strengths of the present invention will be made clear by the description below. Further, the advantages of the present invention will be evident from the following explanation in reference to the drawings.

BRIEF DESCRIPTION OF DRAWINGS

FIG. 1 is a circuit diagram illustrating a simulation circuit for a power amplifier of one embodiment of the present invention.

FIG. 2(a) through FIG. 2(d) are graphs showing simulated results of output power characteristics of the power amplifier that were measured by use of the simulation circuit illustrated in FIG. 1.

FIG. 4 is graph showing a simulated result of output power characteristic of the power amplifier that was measured by use of the simulation circuit illustrated in FIG. 3.

FIG. 5 is graph showing another simulated results of output power characteristics of the power amplifier that were measured by use of the simulation circuit illustrated in FIG. 3.

DESCRIPTION OF EMBODIMENTS

[Prerequisite Art]

The below describes a prerequisite art for a power amplifier of the present invention.

Figure 8:
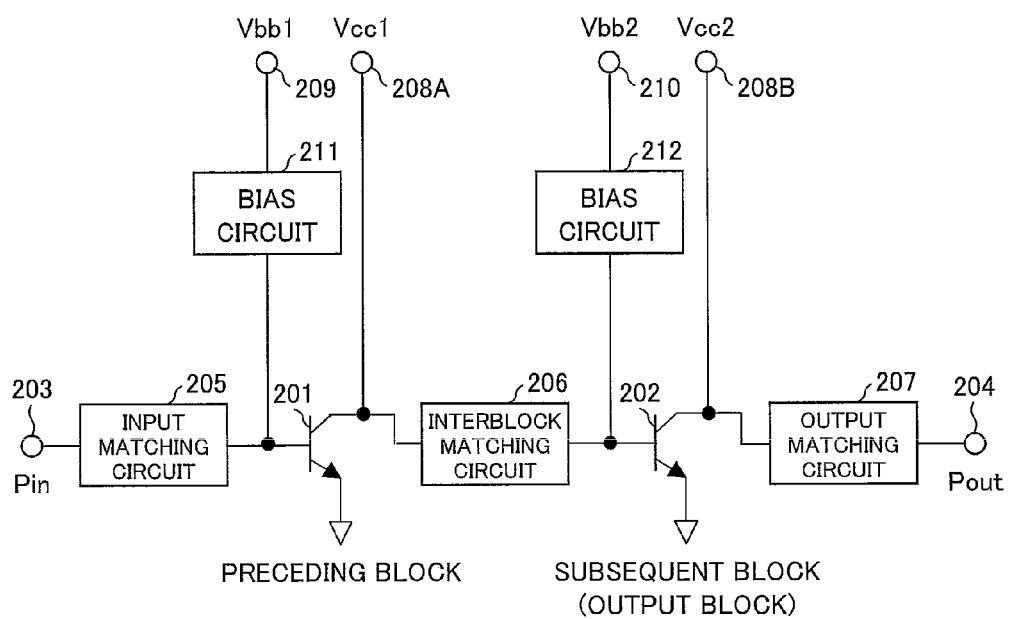
FIG. 8 is a circuit diagram illustrating a basic circuit configuration of a general power amplifier.

FIG. 8 is a circuit diagram illustrating a basic circuit configuration of a general power amplifier such as the power amplifier of the present invention or a power amplifier disclosed in Patent Literature 1.

The power amplifier illustrated in FIG. 8 includes a preceding block bipolar transistor 201 for signal amplification-use and a subsequent block bipolar transistor 202 for signal amplification-use (output block bipolar transistor 202).

For convenience, hereinafter, the preceding block bipolar transistor 201 for signal amplification-use and the subsequent block bipolar transistor 202 for signal amplification-use are referred to as transistor 201 and transistor 202, respectively.

The transistor 201 is an NPN bipolar transistor, and constitutes the preceding block of the two series-connected amplifier blocks in the power amplifier.

The transistor 202 is an NPN bipolar transistor, and constitutes an output block of the two series-connected amplifier blocks in the power amplifier.

That is, the power amplifier illustrated in FIG. 8 includes a plurality of bipolar transistors each serving as an element for power amplification. The plurality of bipolar transistors sequentially amplify a signal supplied to the power amplifier. That is, the power amplifier includes a plurality of amplifying blocks each serving as a different amplifying block in the power amplifier.

The power amplifier illustrated in FIG. 8 can be construed as a power amplifier including two amplifying blocks in which the transistor 201 (preceding block) and the transistor 202 (subsequent block; output block) serve as mutually different amplifying blocks.

Emitter terminals of the transistors 201 and 202 are both grounded. Other connections in the transistors 201 and 202 are described later, together with connections to other components.

The power amplifier illustrated in FIG. 8 includes an input terminal 203, an output terminal 204, an input matching circuit 205, an interblock matching circuit 206, an output matching circuit 207, supply voltage input terminals 208A and 208B, supply voltage terminals 209 and 210, and bias circuits (base bias circuits) 211 and 212.

The input terminal 203 is a terminal via which a signal, to be subjected to power amplification by the power amplifier, such as a digitally-modulated signal (modulated wave of a digital signal) is supplied. Hereinafter, a power signal supplied to the power amplifier via the input terminal 203 is referred to as input power Pin.

The output terminal 204 is a terminal via which a signal that has been subjected to power amplification by the power amplifier is outputted to the outside of the power amplifier. Hereinafter, a power signal outputted outside the power amplifier via the output terminal 204 is referred to as output power Pout.

The input matching circuit 205 is provided between the input terminal 203 and a base terminal of the transistor 201. The input matching circuit 205 is a circuit for preventing signal reflection occurred between the transistor 201_and the input terminal 203. The input matching circuit 205 carries out impedance matching so that the impedance of the input terminal 203 is equal to the impedance of the transistor 201.

The interblock matching circuit 206 is provided between a collector terminal of the transistor 201 and a base terminal of the transistor 202. The interblock matching circuit 206 carries out impedance matching so that an optimized load impedance of the transistor 201 is equal to an input impedance of the transistor 202.

The output matching circuit 207 is provided between a collector terminal of the transistor 202 and the output terminal 204. The output matching circuit 207 carries out impedance matching so that an optimized impedance of the transistor 202 is equal to an impedance (generally, 50Ω) of the output terminal 204.

The supply voltage input terminal 208A is connected to the collector terminal of the transistor 201. A supply voltage Vcc1 is applied to the collector terminal of the transistor 201, in response to supply of the supply voltage Vcc1 from a voltage source (not illustrated) via the supply voltage input terminal 208A.

The supply voltage input terminal 208B is connected to the collector terminal of the transistor 202. A supply voltage Vcc2 is applied to the collector terminal of the transistor 202, in response to supply of the supply voltage Vcc2 from a voltage source (not illustrated) via the supply voltage input terminal 208B.

The supply voltage terminal 209 is connected, via the bias circuit (preceding block bias circuit) 211, to a node between the input matching circuit 205 and the base terminal of the transistor 201. A supply voltage Vbb1 is applied to the bias circuit 211, in response to supply of the voltage Vbb1 from a voltage source (not illustrated) via the supply voltage terminal 209. The bias circuit 211 generates a base bias current in accordance with the voltage Vbb1, and supplies the base bias current to the base terminal of the transistor 201.

The supply voltage terminal 210 is connected via the bias circuit (output block bias circuit) 212 to a node between the interblock matching circuit 206 and the base terminal of the transistor 202. A voltage Vbb2 is applied to the bias circuit 212, in response to supply of the voltage Vbb2 from a voltage source (not illustrated) via the supply voltage terminal 210. The bias circuit 212 generates a base bias current in accordance with the voltage Vbb2, and supplies the base bias current to the base terminal of the transistor 202.

COMPARATIVE EXAMPLE

The below describes (i) a simulation circuit of the power amplifier, disclosed in Patent Literature 1 (hereinafter, referred to as "conventional power amplifier"), which is a comparative example, and (ii) simulated results of output power characteristics measured by use of the simulation circuit. The simulation circuit is prepared on the basis of the basic circuit configuration of the power amplifier illustrated in FIG. 8.

Figure 9:
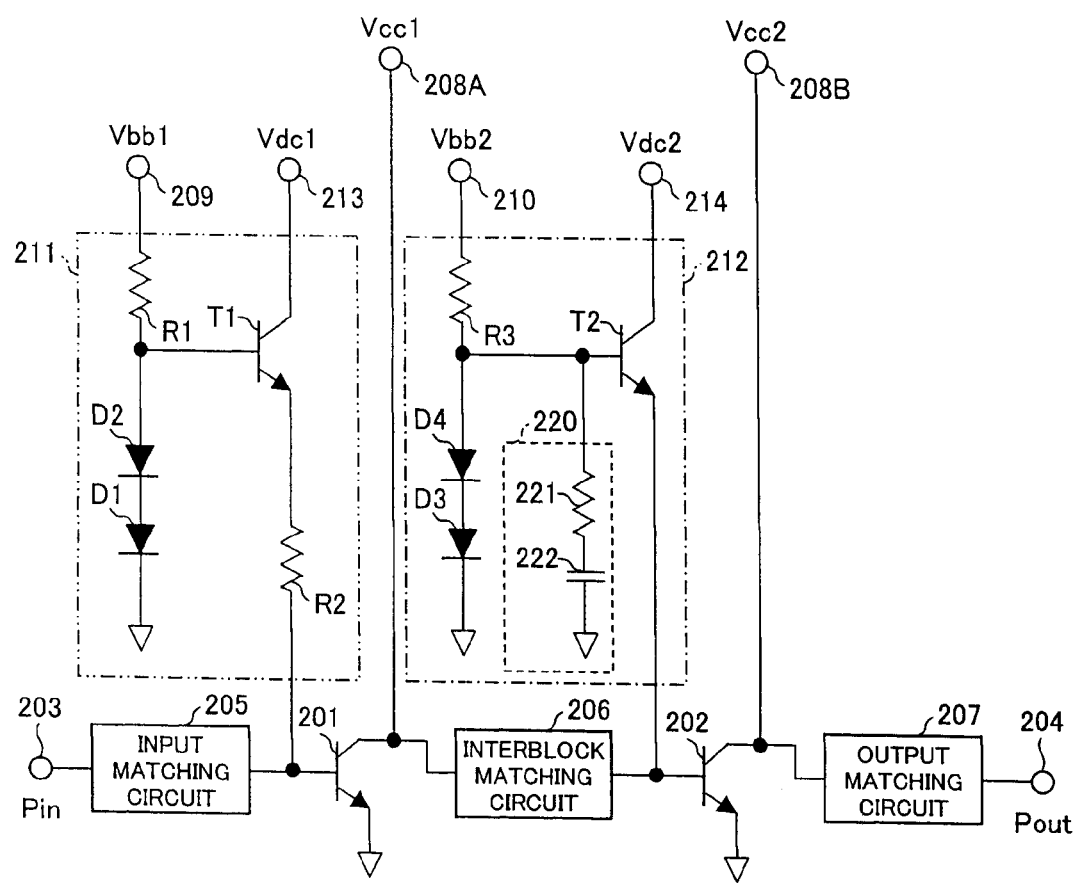
FIG. 9 is a circuit diagram illustrating a configuration of a simulation circuit for a power amplifier according to a conventional art.

FIG. 9 is a circuit diagram illustrating the simulation circuit for the conventional power amplifier.

As illustrated in FIG. 9, according to a simulation circuit of the conventional power amplifier, (i) the bias circuit 211 in the basic circuit configuration of the power amplifier illustrated in FIG. 8 is configured by diodes D1 and D2, resistors R1 and R2, and a bipolar transistor T1, and (ii) the bias circuit 212 in the basic circuit configuration is configured by diodes D3 and D4, a resistor R3, a bipolar transistor T2, and a distortion compensating circuit (output block distortion compensating circuit) 220 having a resistor 211 and a capacitor 222.

One end of the resistor R1 is connected to a supply voltage terminal 209. The other terminal of the resistor R1 is connected to an anode of the diode D2 and a base terminal of the bipolar transistor T1. A cathode of the diode D2 is connected to an anode of the diode D1. A cathode of the diode D1 is grounded. A collector terminal of the bipolar transistor T1 is connected to a DC power source (not illustrated) for supplying a DC supply voltage Vdc1, via a supply voltage terminal 213. An emitter terminal of the bipolar transistor T1 is connected to one end of the resistor (preceding block base ballast resistor) R2, which is a ballast resistor for preventing thermal runaway of the transistor 201. The other end of the resistor R2 is connected to a node between an input matching circuit 205 and a base terminal of the transistor 201.

One end of the resistor R3 is connected to a supply voltage terminal 210. The other end of the resistor R3 is connected to an anode of the diode D4 and a base terminal of the bipolar transistor T2. A cathode of the diode D4 is connected to an anode of the diode D3. A cathode of the diode D3 is grounded. A collector terminal of the bipolar transistor T2 is connected to a DC power source (not illustrated) for supplying a DC supply voltage Vdc2, via a supply voltage terminal 214. An emitter terminal of the bipolar transistor T2 is connected to a noted between an interblock matching circuit 206 and a base terminal of a transistor 202.

Further, a base terminal of the bipolar transistor T2 is connected to the distortion compensating circuit 220. The distortion compensating circuit 220 is a series circuit in which the resistor 221 and the capacitor 222 are connected in series. Specifically, one end of the resistor 221 is connected to the base terminal of the bipolar transistor T2. The other end of the resistor 221 is connected to one end of the capacitor 222. The other end of the capacitor 222 is grounded.

The below describes how a base bias current is generated in the bias circuits 211 and 222.

First, the below describes a DC operation. Respective voltages are applied to the collector terminal of the transistor 201 and the collector terminal of the bipolar transistor T1 for supplying a base current to the transistor 201. The bipolar transistor T1 is turned on while a voltage Vbb1 is further applied to the bias circuit 211. This causes a base current to flow into the base terminal of the transistor 201. In accordance with the base current, a collector current (idle current) passes through the transistor 201. Similarly, respective voltages are applied to the collector terminal of the transistor 202 and the collector terminal of the bipolar transistor T2 for supplying a base current to the transistor 202. The bipolar transistor T2 is turned on while a voltage Vbb2 is further applied to the bias circuit 212. This causes a base current to flow into the base terminal of the transistor 202. In accordance with the base current, a collector current (idle current) passes through the transistor 202. The idle currents which flow from the bipolar transistors T1 and T2 vary depending on the voltages Vbb1 and Vbb2, respectively. However, the idle currents are determined in accordance with respective resistances of the resistors R1 and R3. This is because each bias voltage is generally set to a specific voltage (e.g., 2.8V). Operating points (Class A, AB, or B) of the transistors 201 and 202 are determined in accordance with the idle currents thus determined, respectively. Note that the operating points are not affected by an impedance of the distortion compensating circuit due to the DC operation.

The below describes operation (AC operation) occurs in a case where a modulated signal (input signal Pin) is supplied via the input terminal 203 during DC operation. Collector currents flow into the collector terminals of the transistors 201 and 202 in accordance with load impedances which are obtained when the transistors 201 and 202 are viewed from their respective collector terminals. In response to the collector currents, base currents are supplied from the bias circuits 211 and 212 to the transistors 201 and 202, respectively. The distortion compensation circuit 220 is added to the bias circuit 212 connected to the base terminal of the transistor 202. Therefore, an output impedance of the bias circuit 212 depends on an impedance of the distortion compensating circuit 220 during AC operation. The base terminal of the bipolar transistor T2 is AC grounded (an impedance of the base terminal of the bipolar transistor T2 is AC grounded), for example, in a case of conditions in the distortion compensating circuit 220 which allow maximization of a saturated output power of the transistor 202, i.e., in a case where a resistance Rx of the resistor 221 is 0Ω and a capacitance Cx of the capacitor 222 is infinity (to be described later in detail). In this case, an output impedance of the bias circuit 212 becomes extremely small.

Figure 10:
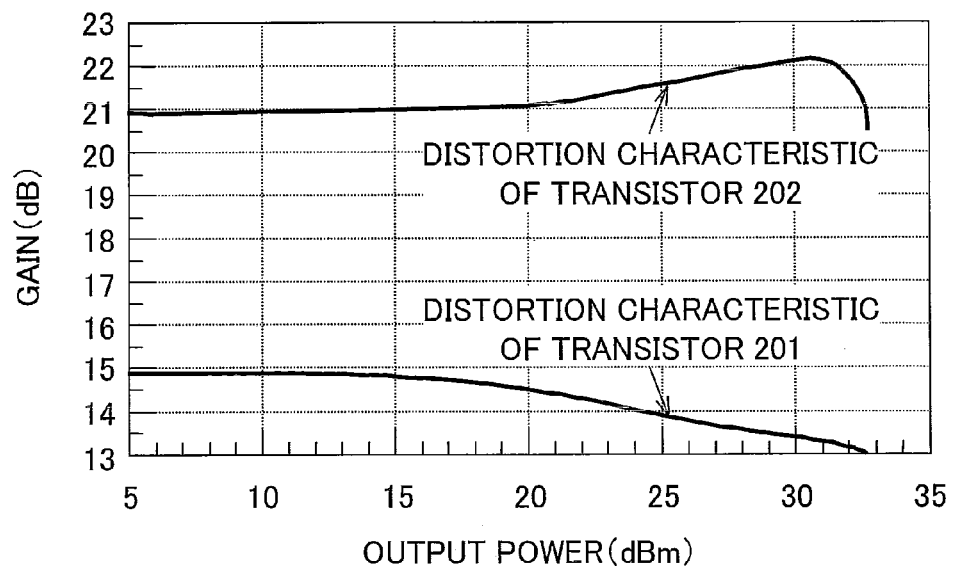
FIG. 10(a) is a graph showing relations between output powers and gains (i.e., distortion characteristics), for both a preceding block bipolar transistor and an output block bipolar transistor.
FIG. 10(b) is a graph showing relations between output powers and gains (i.e., distortion characteristic) of the power amplifier illustrated in FIG. 9.
Figure 10:
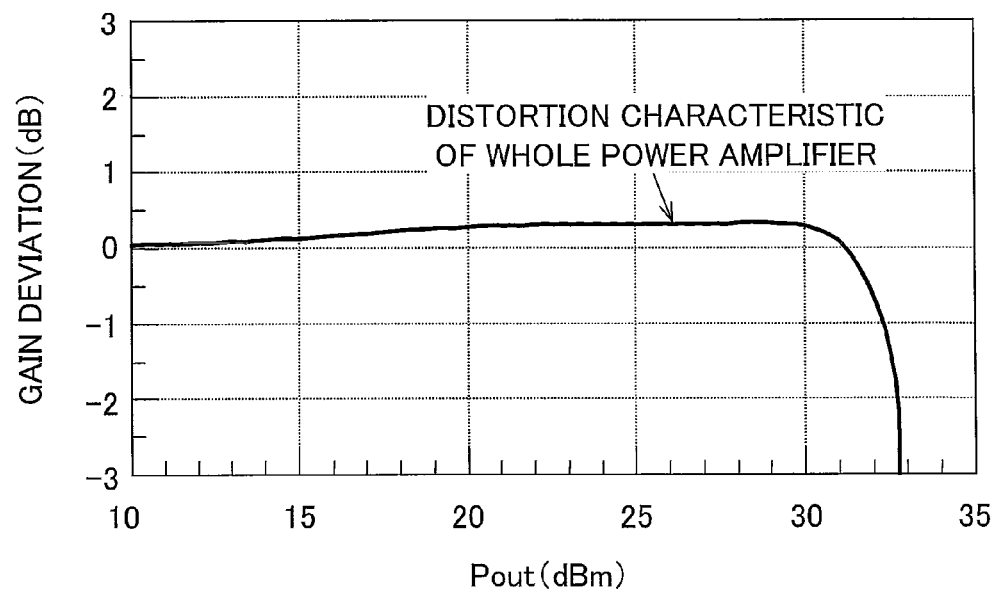

A base bias point of the transistor 201 in the conventional power amplifier illustrated in FIG. 9, which base bias point is not subjected to distortion compensation made by the distortion compensating circuit 220, is set to a base bias point of Class A or Class AB close to Class A. As shown in FIG. 10(a), the transistor 201 has a distortion characteristic in which a gain decreases with an increase in output power (That is, a gain is distorted in a minus direction).

A base bias point of the transistor 202 in the conventional power amplifier illustrated in FIG. 9, which base bias point is subjected to distortion compensation made by the distortion compensating circuit 220, is set to a base bias point of Class B or Class AB close to Class B. As shown in FIG. 10(a), the transistor 202 has a distortion characteristic in which a gain increases with an increase in output power (That is, a gain is distorted in a plus direction).

The below explains the reasons why the transistors 201 and 202 have their respective distortion characteristics.

Figure 11:
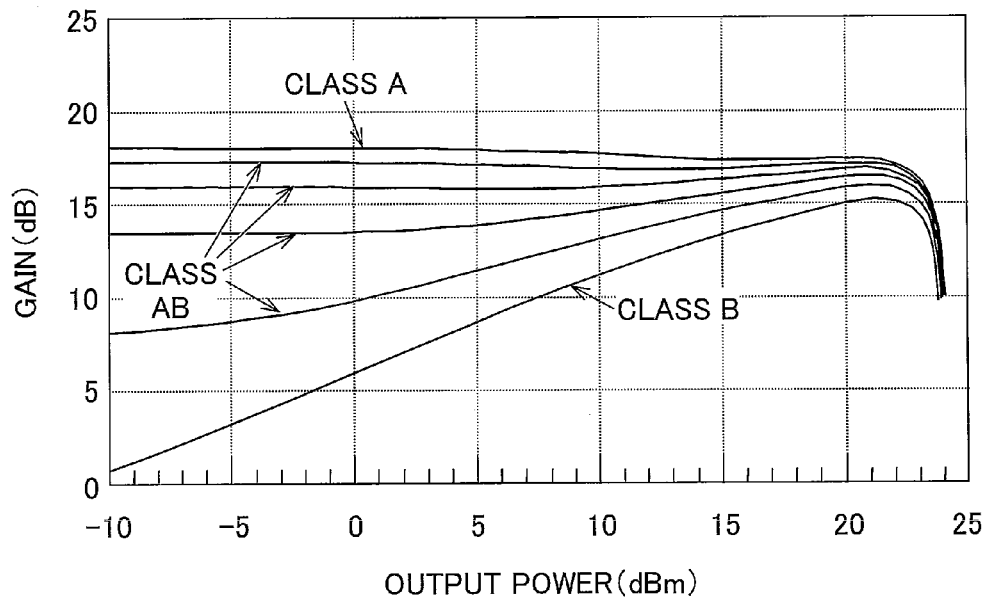
FIG. 11(a) is a graph showing relations between output powers and gains in cases where an operating point of a transistor is changed to each of operating points according to Class B, Class AB, and Class A.
FIG. 11(b) is a graph showing relations between output powers and current densities of collector currents in cases where an operating point of the transistor is changed to each of operating points according to Class B, Class AB, and Class A.
Figure 11:
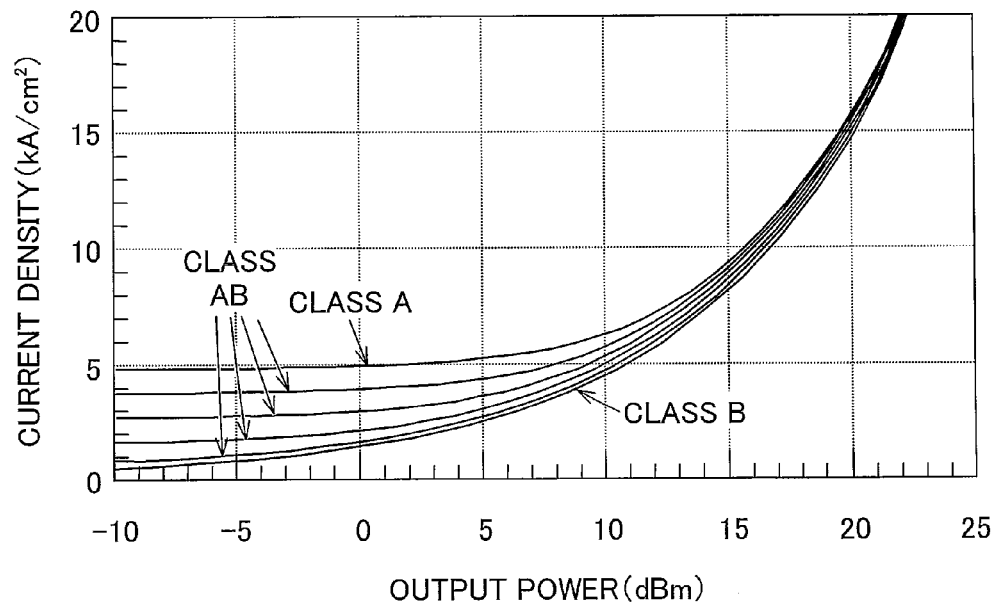

FIG. 11(a) is a graph, showing a relation between respective output powers (horizontal axis) of a transistor and respective gains (vertical axis) of the transistor, obtained in a case where an operating point of the transistor is changed to be of Class B, AB, or A operation.

FIG. 11(b) is a graph showing a relation between respective output powers (horizontal axis) of the transistor and respective current densities (vertical axis) of collector currents of the transistor, obtained in a case where an operating point of the transistor is changed to be of Class B, AB, or A.

In general, a gain of a transistor varies depending on a current density (a current value per unit emitter area) of a collector terminal. Therefore, the transistor has a characteristic in which the higher the current density is, the higher the gain.

As shown in FIG. 11(b), the transistor 201 of Class A operation has a collector current having a sufficiently high current density (approximately 5 kA/cm$^2$) from when an output power is small. This allows the transistor 201 to have a substantially constant gain characteristic (see FIG. 11(a)) over a wide range of output powers from a small signal (low output power) to a large signal (high output power). However, an increase in base current of the transistor 201 due to an increase in input power to the transistor 201 causes a decrease in base voltage of the transistor 201 due to a voltage drop caused by an internal resistance of the bias circuit 211. The decrease in base voltage varies depending on the internal resistance (i.e., output impedance) of the bias circuit 211. This causes a slight reduction in gain of the transistor 201 (see FIG. 11(a)) when the output power increases. In other words, the transistor 201 of Class A operation has a distortion characteristic in which a gain decreases with an increase in output power.

On the other hand, the transistor 202 of Class AB operation has a characteristic in which the gain is low in a small signal area where the output power is small (see FIG. 11(a)) since the transistor 202 has a small collector current density, falling in a range from approximately 2 kA/cm$^2$ to 3 kA/cm$^2$ (see FIG. 11(b)), in the small signal area, whereas the gain increases in a large signal area where the output power is large since the current density of the transistor 202 increases with a gradual increase in collector current in the large signal area.

In FIG. 9, by changing a resistance Rx of the resistor 221 and/or a capacitance Cx of the capacitor 222, the distortion compensating circuit 220 appropriately changes an output impedance of the bias circuit 212. The distortion compensating circuit 220 changes a distortion characteristic of an output power of the transistor 202 with respect to an input power in accordance with a change in output impedance of the bias circuit 212

The distortion compensating circuit 220 adjusts the distortion characteristic of the transistor 202 as follows. Specifically, the distortion compensating circuit 220 sets an output impedance of the bias circuit 212 connected to the base terminal of the transistor 202 so that a distortion of an output power with respect to an input power is canceled, as a whole, in the conventional power amplifier through synthesizing the amplitude distortion characteristic of the transistor 202 shown in FIG. 10(a) and that of the transistor 201 shown in FIG. 10(a) In other words, the distortion compensating circuit 220 changes the distortion characteristic of the transistor 202 to a distortion characteristic substantially opposite to the distortion characteristic of the transistor 201. This causes a cancellation of (i) a distortion caused in the transistor 201 which is the preceding block and (ii) a distortion caused in the transistor 202 which is the subsequent block (output block). This substantially cancels out, as a whole in the conventional power amplifier illustrated in FIG. 9, an amplitude distortion of an output power Pout (see FIG. 10(b)). That is, a gain deviation becomes substantially 0 dB over a wide range of amplitude of output powers Pout.

FIG. 12(a) through FIG. 12(d) are graphs showing simulated results of output power characteristics of the conventional power amplifier illustrated in FIG. 9.

In graphs to be explained below such as FIG. 12(a) through FIG. 12(d), each vertical axis represents gain deviations dGain1 (unit: dB) of a power amplifier while each horizontal axis represents output powers Pout (unit: dBm) of the power amplifier.

A gain deviation represents a gain change caused by an increase in output power, on the basis of a gain (0 dB) obtained in the case of a small signal (i.e., low output power). A linear power amplifier preferably has a characteristic in which a gain deviation does not vary even if an output power increases, i.e., a characteristic in which an amplitude distortion is small. In general, dependency of a gain deviation of a liner power amplifier on an output power remains constant up to a certain output power. Thereafter, an output power does not increase no matter how an input power is increased. A maximum output power is referred to as saturated output power. A linear power amplifier preferably has as large a saturated output power as possible.

Figure 12A:
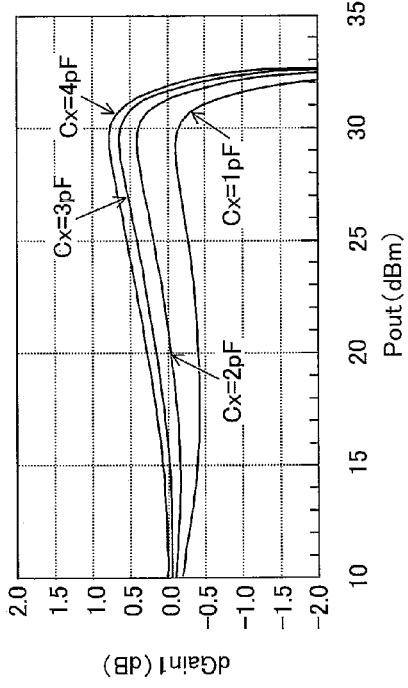
FIG. 12(a) through FIG. 12(d) are graphs showing simulated results of output power characteristics of the power amplifier according to the conventional art that were measured by use of the simulation circuit illustrated in FIG. 9.

FIG. 12(a) is a graph showing how the gain deviations dGain1 vary depending on output powers under the condition where a capacitance Cx of the capacitor 222 of the distortion compensating circuit 220 is fixed to 4 pF and a resistance Rx of the resistor 221 is 50Ω, 150Ω, 250Ω, or 350Ω. FIG. 12(b) is a graph showing an enlarged view of a range of output powers Pout from 27 dBm to 33 dBm in the graph of FIG. 12(a).

Figure 12C:
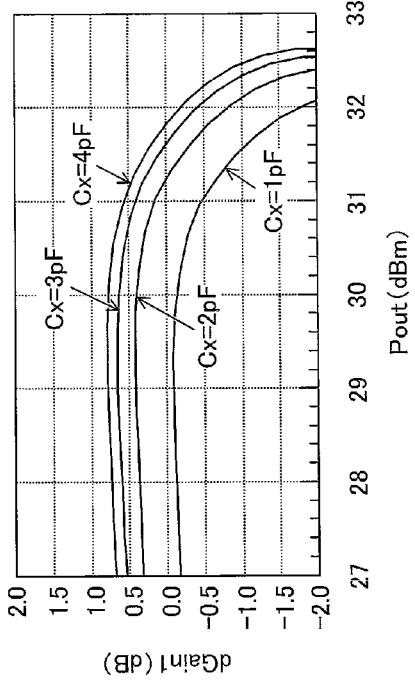
Figure 12B:
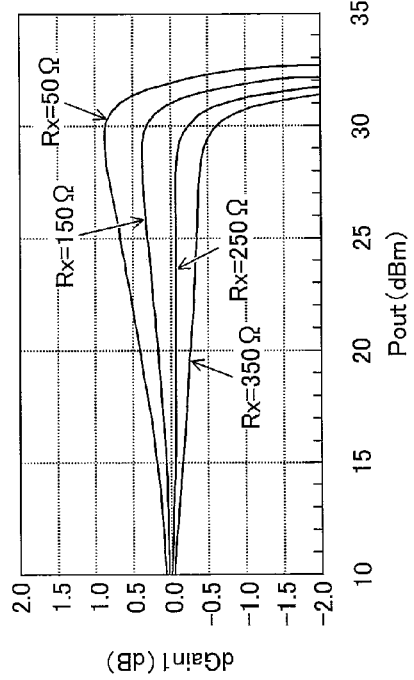
Figure 12D:
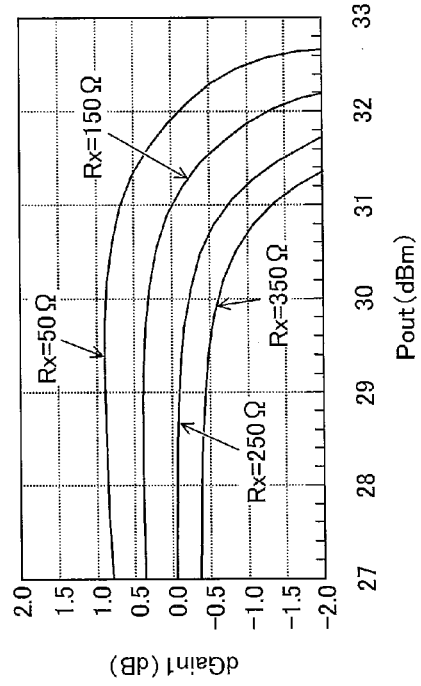
Figure 13:
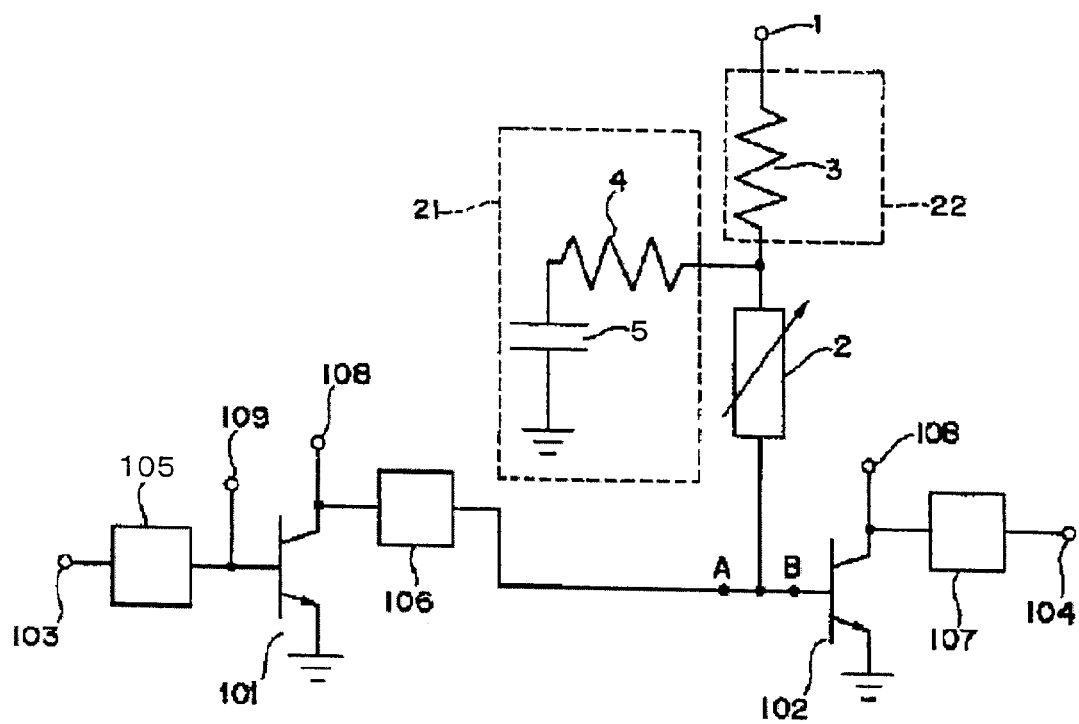
FIG. 13 is a circuit diagram illustrating a circuit configuration of the power amplifier according to the conventional art.

FIG. 12(c) is a graph showing how the gain deviations dGain1 vary depending on output powers under the condition where a resistance Rx of the resistor 221 of the distortion compensating circuit 220 is fixed to 50Ω and a capacitance Cx of the capacitor 221 is 1 pF, 2 pF, 3 pF, or 4 pF. FIG. 12(d) is a graph showing an enlarged view of a range of output powers Pout from 27 dBm to 33 dBm in the graph of FIG. 12(c).

In both graphs of FIG. 12(a) and FIG. 12(b), for example, a saturated output power is approximately 32.6 dBm in a case where a resistance Rx of the resistor 221 of the distortion compensating circuit 220 is 50Ω. In a case where the resistance Rx increases in the order of 50Ω, 150Ω, 250Ω, and 350Ω, each gain deviation dGain1 changes as is shown in the graphs. In other words, the conventional power amplifier can adjust a gain deviation dGain1 with respect to an output power Pout, by changing a resistance Rx of the resistor 221 in the distortion compensating circuit 220. This allows a reduction in distortion of the power amplifier. According to the graph of FIG. 12(a), an amplitude distortion of the conventional power amplifier illustrated in FIG. 9 is minimized in a case where a resistance Rx of the resistor 221 in the distortion compensating circuit 220 is set to 250Ω.

On the other hand, the greater the resistance Rx of the resistor 221 in the distortion compensating circuit 220 is, the lower the saturated output power of the conventional power amplifier becomes. As shown in FIG. 12(b), particularly, a saturated output power drops to approximately 31.4 dBm in a case where a resistance Rx of the resistor 221 of the distortion compensating circuit 220 is set to 350Ω. This saturated output power is smaller by approximately 1.2 dB, as compared to a case where a resistance Rx is set to 50Ω.

In both graphs of FIG. 12(c) and FIG. 12(d), a saturated output power is approximately 32.6 dBm in a case where, for example, a capacitance Cx of the capacitor 222 of the distortion compensating circuit 220 is 4 pF. In a case where the capacitance Cx decreases in the order of 4 pF, 3 pF, 2 pF, and 1 pF, each gain deviation dGain1 changes as is shown in the graphs. In other words, the conventional power amplifier can adjust a gain deviation dGain1 with respect to an output power Pout, by changing a capacitance Cx of the capacitor 222 in the distortion compensating circuit 220. This allows a reduction in distortion of the power amplifier. According to the graph of FIG. 12(c), an amplitude distortion of the conventional power amplifier illustrated in FIG. 9 is minimized in a case where a capacitance Cx of the capacitor 222 in the distortion compensating circuit 220 is set to 2 pF.

On the other hand, the lower the capacitance Cx of the capacitor 222 in the distortion compensating circuit 220, the lower the saturated output power of the conventional power amplifier becomes. As shown in FIG. 12(d), particularly, a saturated output power drops to approximately 32.1 dBm in a case where a capacitance Cx of the capacitor 222 of the distortion compensating circuit 220 is set to 1 pF. This saturated output power is smaller by approximately 0.5 dBm, as compared to a case where a capacitance Cx is set to 4 pF.

As described above, it is necessary to properly adjust a resistance Rx of the resistor 221 and a capacitance Cx of the capacitor 222 in order to realize a highly efficient low-distortion power amplifier through distortion compensation made by the distortion compensation circuit 220 of the conventional power amplifier. However, it is ideal in the conventional power amplifier that a resistance Rx of the resistor 221 and a capacitance Cx of the capacitor 222 are set to 0 and infinity, respectively, in order to minimize a reduction in saturated output power. On this account, a problem arises that a saturated output power is reduced as a whole in the conventional power amplifier, in a case where a resistance Rx of the resistor 221 is unsatisfactorily set to a resistance greater than 0 and/or a capacitance Cx of the capacitor 222 is unsatisfactorily set to a capacitance smaller than infinity.

First Embodiment

The below describes a simulation circuit of a power amplifier in accordance with one embodiment of the present invention, and simulated results of output power characteristics measured by use of the simulation circuit.

FIG. 1 is a circuit diagram illustrating a configuration of the simulation circuit of the power amplifier in accordance with the one embodiment of the present invention.

As illustrated in FIG. 1, a power amplifier 1 of the present embodiment can be realized by a simulation circuit in which a distortion compensating circuit 230 is added to a bias circuit 211 in an arrangement of a simulation circuit of the conventional power amplifier illustrated in FIG. 9. The distortion compensating circuit 230 is a series circuit composed of a resistor 231 and a capacitor 232. As illustrated in FIG. 1, the series circuit is preferably connected in parallel with a resistor R2.

The power amplifier 1 illustrated in FIG. 1 is arranged such that the distortion compensating circuit 230 is additionally provided in parallel with the resistor R2 that serves as a base ballast resistor. With the circuit configuration, a bypass effect brought by the capacitor 232 prevents a decrease in base voltage of a transistor 201 caused by the resistor R2, thereby further preventing a decrease in saturated output power of the transistor 201. In a case where an output impedance of the bias circuit 211 is adjusted, the distortion compensating circuit 230 is preferably connected in parallel with the resistor R2.

The distortion compensating circuit 230 appropriately changes an output impedance of the bias circuit 211 connected to a base terminal of the transistor 201, in accordance with a change in resistance Ry of the resistor 231 and/or a change in capacitance Cy of the capacitor 232. This allows the distortion compensating circuit 230 to change a distortion characteristic of an output power with respect to an input power, in the transistor 201.

As is the case with the conventional power amplifier illustrated in FIG. 9, a base bias point of the transistor 201 of the power amplifier 1 illustrated in FIG. 1 is set to a base bias point of Class A or Class AB close to Class A while a base bias point of the transistor 202 of the power amplifier 1 is set to a base bias point of Class B or Class AB close to Class B. The transistor 201 has the distortion characteristic in which its gain decreases with an increase in output power whereas the transistor 202 has the distortion characteristic in which its gain increases with an increase in output power.

Then, in the distortion compensating circuit 220 in the power amplifier 1 illustrated in FIG. 1, a resistance Rx of a resistor 221 is set to 0 and a capacitance Cx of a capacitor 222 is set to infinity. Thus, the distortion compensating circuit 220 sets an output impedance of the bias circuit 212 so that a saturated output power of the transistor 202 is maximized. Technically, a capacitance Cx of the capacitor 222 in the power amplifier 1 or in a later-described power amplifier 2 (see FIG. 3) is set such that the capacitance Cx has a sufficiently large impedance in accordance with a frequency of an input power Pin, i.e., such that the bias circuit 212 has a sufficiently small impedance. For example, a capacitance Cx is set to approximately 10 pF in a case where an operating frequency of the power amplifier 1 or 2 is 2 GHz or higher.

Then, an output impedance of the bias circuit 211 is set in the power amplifier 1 illustrated in FIG. 1, by appropriately changing a resistance Ry of the resistor 231 in the distortion compensating circuit 230 and/or a capacitance Cy of the capacitor 232 in the distortion compensating circuit 230, thereby adjusting the distortion characteristic of the transistor 201.

In order to adjust the distortion characteristic of the transistor 201, specifically, the distortion compensating circuit 230 sets an output impedance of the bias circuit 211 so that a distortion of an output power with respect to an input power is canceled out as a whole in the power amplifier 1 through synthesizing the distortion characteristic of the transistor 202 whose saturated output power has been maximized and that of the transistor 201.

FIG. 2(a) through FIG. 2(d) are graphs showing simulated results of output power characteristics of the power amplifier 1 measured by use of the simulation circuit illustrated in FIG. 1.

In the graph of FIG. 2(a), a vertical axis represents gain deviations dGain1 of the power amplifier 1 while a horizontal axis represents amplitude of output powers Pout of the power amplifier 1. The graph shows how the gain deviations dGain1 vary depending on output powers under the condition where a resistance Ry of the resistor 231 is 0Ω, 10Ω, 20Ω, 30Ω, or 40Ω. FIG. 2(b) is a graph showing an enlarged view of a range of amplitude of output powers Pout from 27 dBm to 33 dBm in the graph of FIG. 2(a). In both FIG. 2(a) and FIG. 2(b), capacitances Cy of the capacitor 232 in the distortion compensating circuit 230 are equal (4 pF).

In the graph of FIG. 2(c), a vertical axis represents gain deviations dGain1 of the power amplifier 1 while a horizontal axis represents amplitude of output powers Pout of the power amplifier 1. The graph shows relations between gain deviations dGain1 and amplitude of output powers Pout of the whole power amplifier 1 under the condition where a capacitance Cy of the capacitor 232 is 1 pF, 2 pF, 3 pF, or 4 pF. FIG. 2(d) is a graph showing an enlarged view of a range of amplitude of output powers Pout from 27 dBm to 33 dBm in the graph of FIG. 2(c). In both FIG. 2(c) and FIG. 2(d), resistances Ry of the resistor 231 in the distortion compensating circuit 230 are equal (0Ω).

The graphs of FIG. 2(a) through FIG. 2(d) assume in the distortion compensating circuit 220 of the power amplifier 1 illustrated in FIG. 1 that a resistance Rx of the resistor 221 is 0Ω and a capacitance Cx of the capacitor 222 is infinity.

In both graphs of FIG. 2(a) and FIG. 2(b), for example, a saturated output power is approximately 32.7 dBm in a case where a resistance Ry of the resistor 231 of the distortion compensating circuit 230 is 0Ω. In a case where the resistance Ry increases in the order of 0Ω, 10Ω, 20Ω, 30Ω, and 40Ω, each gain deviation dGain1 changes as is shown in the graphs. In other words, the power amplifier 1 can adjust a gain deviation dGain1 with respect to an output power Pout, by changing a resistance Ry of the resistor 231 in the distortion compensating circuit 230. This allows a reduction in distortion of the power amplifier 1. According to the graph of FIG. 2(a), an amplitude distortion of the power amplifier 1 is minimized in a case where a resistance Ry of the resistor 231 of the distortion compensating circuit 230 is set to 30Ω. On the other hand, saturated output powers are substantially constant (approximately 32.6 to 32.7 dBm) even if a resistance Ry of the resistor 231 in the distortion compensating circuit 230 varies.

Thus, according to the power amplifier 1 (see FIG. 1) which is configured in advance so that a resistance Rx of the resistor 221 of the distortion compensating circuit 220 is 0Ω and a capacitance Cx of the capacitor 222 of the distortion compensating circuit 220 is infinity, it is possible to obtain a high saturated output power falling in a range from approximately 32.6 dBm to approximately 32.7 dBm (see FIG. 2(b)), irrespective of a resistance Ry of the resistor 231 in the distortion compensating circuit 230.

In both graphs of FIG. 2(c) and FIG. 2(d), for example, a saturated output power is approximately 32.7 dBm in a case where a capacitance Cy of the capacitor 232 in the distortion compensating circuit 230 is 4 pF. In a case where the capacitance Cy increases in the order of 4 pF, 3 pF, 2 pF, and 1 pF, each gain deviation dGain1 changes as shown in the graphs. In other words, the power amplifier 1 can adjust a gain deviation dGain1 with respect to an output power Pout by changing a capacitance Cy of the capacitor 232 in the distortion compensating circuit 230. This allows a reduction in distortion of the power amplifier 1. According to the graph of FIG. 2(c), an amplitude distortion of the power amplifier 1 is minimized in a case where a capacitance Cy of the capacitor 232 in the distortion compensating circuit 230 is set to 2 pF. On the other hand, saturated output powers are substantially constant (approximately 32.7 dBm) even if a capacitance Cy of the capacitor 232 in the distortion compensating circuit 230 varies.

As described above, according to the power amplifier 1 (see FIG. 1) which is configured in advance so that a resistance Rx of the resistor 221 in the distortion compensating circuit 220 is 0Ω and a capacitance Cx of the capacitor 222 in the distortion compensating circuit 220 is infinity, it is possible to obtain a high saturated output power of approximately 32.7 dBm as is shown in FIG. 2(d), irrespective of a capacitance Cy of the capacitor 232 in the distortion compensating circuit 230.

Second Embodiment

The below describes a simulation circuit of a power amplifier in accordance with another embodiment of the present invention, and simulated results of output power characteristics measured by use of the simulation circuit.

Figure 3:
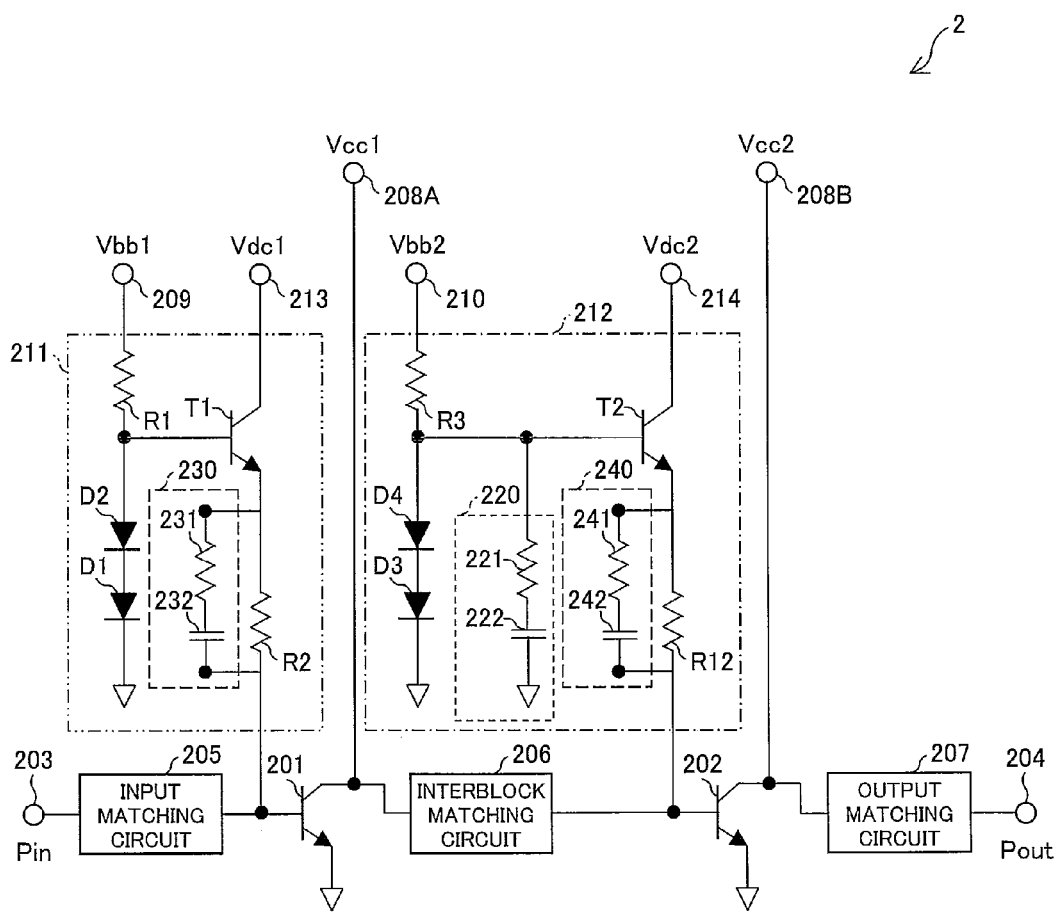
FIG. 3 is a circuit diagram illustrating a simulation circuit of a power amplifier of another embodiment of the present invention.

FIG. 3 is a circuit diagram illustrating a configuration of the simulation circuit of the power amplifier in accordance with the another embodiment of the present invention.

In addition to the circuit configuration of a power amplifier 1 illustrated in FIG. 1, a power amplifier 2 further includes, in a bias circuit 212, (i) a distortion compensating circuit (output block distortion compensating circuit) 240 which is a series circuit composed of a resistor 241 and a capacitor 242 and (ii) a resistor R12 (output block base ballast resistor) (see FIG. 3). The resistor R12 is provided between a base terminal of a transistor 202 and an emitter terminal of a bipolar transistor T2. The resistor R12 is a ballast resistor for preventing thermal runaway of the transistor 202.

The power amplifier 2 illustrated in FIG. 3 is arranged such that the distortion compensating circuit 240 is added in parallel with the resistor R12 serving as a base ballast resistor. The distortion compensating circuit 240 has a circuit configuration (i.e., a series circuit composed of the resistor 241 and the capacitor 242) and a function which are the same as those of the distortion compensating circuit 230 in the circuit configuration of the power amplifier 1 illustrated in FIG. 1. With the circuit configuration, a bypass effect brought by the capacitor 242 prevents a decrease in base voltage of the transistor 202 caused by the resistor R12, thereby further preventing a decrease in saturated output power of the transistor 202.

FIG. 4 is a graph showing a simulated result of an output power characteristic of the power amplifier 2 measured by use of the simulation circuit illustrated in FIG. 3.

In the graph of FIG. 4, a vertical axis represents gain deviations dGain1 of the power amplifier 2 while a horizontal axis represents output powers Pout of the power amplifier 2. The graph shows relations between the gain deviations dGain1 and amplitude of the output powers Pout of the whole power amplifier 2 under the condition where: a resistance Rx of the resistor 221 in the distortion compensating circuit 220 is 0Ω; a capacitance Cx of the capacitor 222 in the distortion compensating circuit 220 is 10 pF (infinity); a resistance Ry of the resistor 231 in the distortion compensating circuit 230 is 0Ω; a capacitance Cy of the capacitor 232 in the distortion compensating circuit 230 is 10 pF; a resistance Rz of the resistor 241 in the distortion compensating circuit 240 is 0Ω; and a capacitance Cz of the capacitor 242 in the distortion compensating circuit 240 is 10 pF. In other words, the graph of FIG. 4 shows the relations between the gain deviations dGain1 and the amplitude of the output powers Pout of the whole power amplifier 2 illustrated in FIG. 3 in a case where both the transistors 201 and 202 of the power amplifier 2 are configured so as to have respective maximum saturated output powers.

In the graph of FIG. 4, a gain deviation dGain1 is maintained so as to fall in a range from approximately 0.0 dB to approximately 0.7 dB. A saturated output power of the power amplifier 2 is approximately 33.0 dBm.

FIG. 5 is a graph showing another simulated results of output power characteristics of the power amplifier 2 measured by use of the simulation circuit illustrated in FIG. 3.

In the graph shown in FIG. 5, a vertical axis represents gain deviations dGain1 of the power amplifier 2 while a horizontal axis represents output powers Pout of the power amplifier 2. The graph shows relations between gain deviations dGain1 and amplitude of output powers Pout of the whole power amplifier 2 in a case where: a resistance Rx of the resistor 221 in the distortion compensating circuit 220 is 0Ω or 180Ω (i.e., the resistance Rx is adjusted); a capacitance Cx of the capacitor 222 in the distortion compensating circuit 220 is 10 pF; a resistance Ry of the resistor 231 in the distortion compensating circuit 230 is 0Ω; a capacitance Cy of the capacitor 232 in the distortion compensating circuit 230 is 10 pF; a resistance Rz of the resistor 241 in the distortion compensating circuit 240 is 0Ω; and a capacitance Cz of the capacitor 242 in the distortion compensating circuit 240 is 10 pF.

In a case where a resistance Rx of the resistor 221 in the distortion compensating circuit 220 is set to 0Ω in the graph of FIG. 5, all the conditions for the power amplifier 2 in FIG. 5 become the same as those in FIG. 4.

On the other hand, in a case where a resistance Rx of the resistor 221 of the distortion compensating circuit 220 is set to 180Ω in the graph of FIG. 5, a gain deviation dGain1 is maintained at approximately 0 dB in a range of output powers Pout from approximately 10 dBm to approximately 30 dBm. That is, the power amplifier 2 has substantially no amplitude distortion in the range. However, in a case where the resistance Rx of the resistor 221 in the distortion compensating circuit 220 is set to 180Ω in the graph of FIG. 5, a saturated output power of the power amplifier 2 is approximately 32.0 dBm. This is lower by approximately 1 dB than a saturated output power of a case where a resistance Rx of the resistor 221 of the distortion compensating circuit 220 is set to 0Ω (33.0 dBm).

Figure 6:
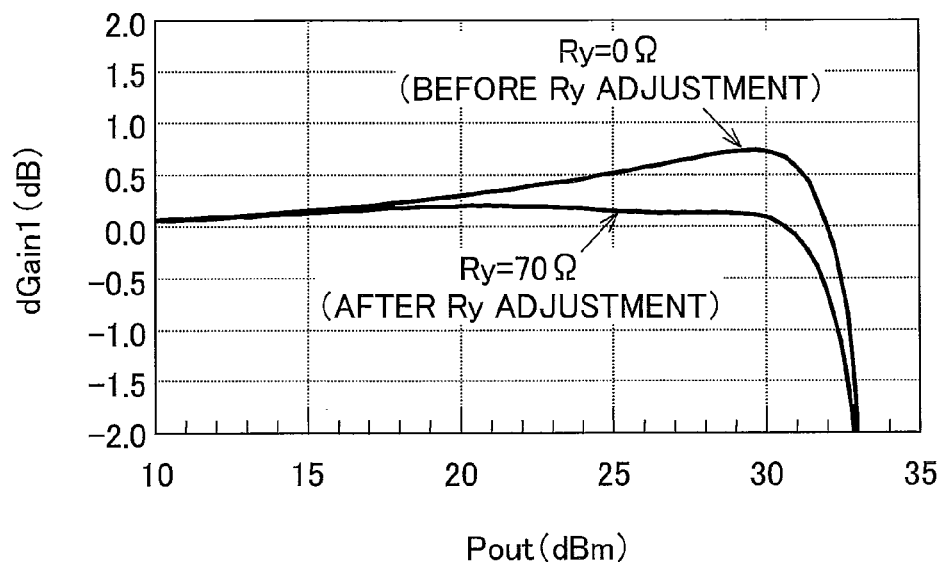
FIG. 6 is graph showing further another simulated results of output power characteristics of the power amplifier that were measured by use of the simulation circuit illustrated in FIG. 3.

FIG. 6 is a graph showing a further simulated results of output power characteristics of the power amplifier 2 measured by use of the simulation circuit illustrated in FIG. 3.

In the graph of FIG. 6, a vertical axis represents gain deviations dGain1 of the power amplifier 2 while a horizontal axis represents amplitudes of output powers Pout of the power amplifier 2. The graph shows relations between gain deviations dGain1 and amplitude of output powers Pout of the whole power amplifier 2, under the condition where a resistance Rx of the resistor 221 in the distortion compensating circuit 220 is 0Ω; a capacitance Cx of the capacitor 222 in the distortion compensating circuit 220 is 10 pF; a resistance Ry of the resistor 231 in the distortion compensating circuit 230 is 0Ω or 70Ω (i.e., the resistance Ry is adjusted); a capacitance Cy of the capacitor 232 in the distortion compensating circuit 230 is set to 10 pF; a resistance Rz of the resistor 241 in the distortion compensating circuit 240 is 0Ω; and a capacitance Cz of the capacitor 242 in the distortion compensating circuit 240 is 10 pF.

In a case where a resistance Ry of the resistor 231 in the distortion compensating circuit 230 is set to 0Ω in the graph of FIG. 6, all the conditions for the power amplifier 2 become the same as those in FIG. 4.

On the other hand, in a case where a resistance Ry of the resistor 231 of the distortion compensating circuit 230 is set to 70Ω in the graph of FIG. 6, a gain deviation dGain1 is maintained in a range from approximately 0.0 dB to 0.2 dB while the output powers Pout falls in a range from approximately 10 dBm to approximately 30 dBm. That is, the power amplifier 2 has a drastically reduced distortion of gains in the range from approximately 10 dBm to approximately 30 dBm. In addition, the power amplifier 2 has a saturated output power of approximately 33.0 dBm, which is hardly differs from that obtained in a case where a resistance Ry of the resistor 231 in the distortion compensating circuit 230 is set to 0Ω.

That is, in a case where a resistance Ry of the resistor 231 of the compensating circuit 230 is set to 70Ω in the graph of FIG. 6, a decrease in saturated output power of the power amplifier 2 is suppressed through the realization of a highly efficient low-distortion power amplifier 2.

Each of the embodiments has dealt with a power amplifier having two amplifying blocks each including a transistor serving as an amplifying element. However, the number of amplifying blocks is not limited to the embodiments. The present invention is applicable to a power amplifier having three or more amplifying blocks each including a transistor serving as an amplifying element.

In a case where the present invention is applied to the power amplifier having three or more amplifying blocks, a saturated output power of a transistor of an output block (last block) of the amplifying blocks is maximized, and a distortion characteristic of at least one of transistors constituting the amplifying block(s) that is(are) followed by the output block is changed by use of a preceding block distortion compensating circuit. A distortion of an output power of the power amplifier with respect to an input power can be canceled out in the manner described above.

Third Embodiment

Figure 7:
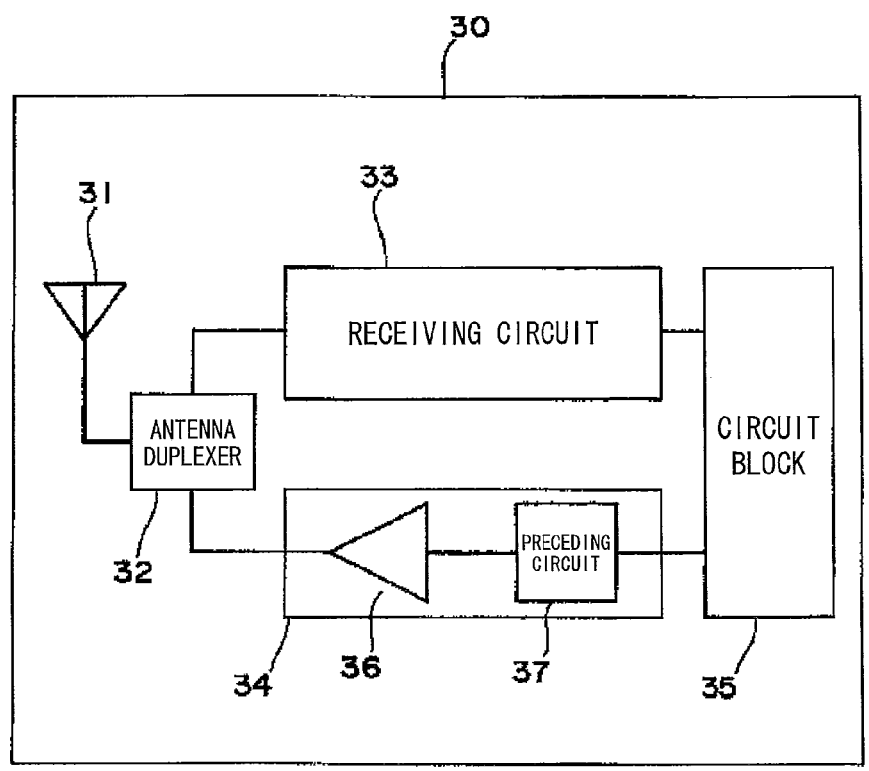
FIG. 7 is a circuit block diagram illustrating an arrangement of a wireless communication apparatus including a power amplifier of the present invention.

FIG. 7 is a circuit block diagram illustrating a circuit configuration of a wireless communication apparatus having a power amplifier of the present invention.

A wireless communication apparatus 30 illustrated in FIG. 7 includes an antenna (transmitting antenna) 31 for outputting outside an output signal (output power Pout) amplified by a power amplifier 36, an antenna duplexer 32 connected to the antenna 31, a receiving circuit 33 connected to an output terminal of the antenna duplexer 32, a transmitting circuit 34 connected to an input terminal of the antenna duplexer 32, a circuit block 35, including a modem, a baseband circuit, and other circuit components, for receiving a received signal from the receiving circuit 33, a circuit 37 (hereinafter, referred to as preceding circuit 37), followed by a power amplifier 36, for receiving a transmitted signal from the circuit block 35, and the power amplifier 36 that amplifies a transmitted signal supplied from the preceding circuit 37 to output the transmitted signal to the antenna duplexer 32. In the wireless communication apparatus 30, the power amplifier 36 and the preceding circuit 37 constitute the transmitting circuit 34 serving as a functional block.

Adoption of the power amplifier 1 (see FIG. 1) or the power amplifier 2 (see FIG. 3) as the power amplifier 36 makes it possible to realize highly efficient low-distortion characteristics of the wireless communication apparatus 30 in transmission.

The power amplifier of the present invention is preferably arranged such that the preceding block bipolar transistor has the first amplitude distortion characteristic in which its gain decreases with an increase in output power; and the output block bipolar transistor has the second amplitude distortion characteristic in which its gain increases with an increase in output power.

In order to obtain the distortion characteristics above, preferably, the operating method of the preceding block bipolar transistor is an operating method according to Class A or Class AB close to Class A, and the operating method of the output block bipolar transistor is an operating method according to Class B or Class AB close to Class B.

A method of the present invention for controlling a power amplifier is preferably arranged such that the preceding block bipolar transistor carries out Class A operation or Class AB operation, and the output block bipolar transistor carries out Class B operation or Class AB operation.

According to the arrangement, an output power supplied from the preceding block bipolar transistor is amplified by the output block bipolar transistor and then externally outputted. This makes it possible to realize, with a simple arrangement, a power amplifier whose gain is stabilized across a wide range of output powers The power amplifier of the present invention is preferably arranged such that the preceding block distortion compensating circuit is a series circuit in which a resistor and a capacitor are connected in series, and causes the preceding block bias circuit to have a target output impedance by changing at least one of a resistance of the resistor and a capacitance of the capacitor. The power amplifier of the present invention is arranged such that the output block distortion compensating circuit is a series circuit in which a resistor and a capacitor are connected in series, and causes the output block bias circuit to have a target output impedance by changing at least one of a resistance of the resistor and a capacitance of the capacitor.

According to the arrangement, an output impedance of the preceding block bias circuit and/or the output block bias circuit can be set to a desired value in accordance with a resistance of the resistor and/or a capacitance of the capacitor. In a case where the output block distortion compensating circuit is the series circuit above, it is possible to adjust an output impedance of the output block bias circuit to 0 by, ideally, setting a resistance of the resistor to 0 and setting a capacitance of the capacitor to infinity. Thus, a saturated output power of the output block bipolar transistor can be maximized.

The power amplifier of the present invention is preferably arranged such that the series circuit is connected in parallel with an output block base ballast resistor connected to the base terminal of the output block bipolar transistor and/or to a preceding block base ballast resistor connected to the base terminal of the preceding block bipolar transistor.

According to the arrangement, connecting the series circuit to the base ballast resistor(s) in parallel makes it possible to suppress a decrease, due to the base ballast resistor(s), in base voltage to be applied to the corresponding preceding block bipolar transistor and/or the corresponding output block bipolar transistor. This makes it possible to further suppress the decrease in saturated output power.

A wireless communication apparatus can produce the same effect, provided that the wireless communication apparatus includes any one of the power amplifiers and a transmitting antenna for receiving an output signal from the power amplifier and for outputting the output signal outside.

The present invention makes it possible to reduce a decrease in saturated output power brought by realization of a highly efficient low-distortion power amplifier.

Therefore, the present invention is applicable to a power amplifier that efficiently amplifies a modulated wave of a digital signal while keeping distortion low in a wireless communication apparatus such as a mobile terminal, a method for controlling a power amplifier, and a wireless communication apparatus.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A power amplifier comprising:
a plurality of amplifying blocks each of which includes a bipolar transistor,
an output block bias circuit which is connected to a base terminal of an output block bipolar transistor, and which constitutes an output block of the plurality of amplifying blocks,
a preceding block bias circuit which is connected to a base terminal of a preceding block bipolar transistor, and which constitutes an amplifying block followed by the output block,
an output block distortion compensating circuit that causes the output block bias circuit to have a low output impedance so that the output block bipolar transistor has a maximized saturated output power, and
a preceding block distortion compensating circuit that causes the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor.

2. The power amplifier as set forth in claim 1, wherein:
the preceding block bipolar transistor has the first amplitude distortion characteristic in which its gain decreases with an increase in output power; and
the output block bipolar transistor has the second amplitude distortion characteristic in which its gain increases with an increase in output power.

3. The power amplifier as set forth in claim 1, wherein
the preceding block distortion compensating circuit is a series circuit in which a resistor and a capacitor are connected in series, and causes the preceding block bias circuit to have a target output impedance by changing at least one of a resistance of the resistor and a capacitance of the capacitor.

4. The power amplifier as set forth in claim 1, wherein
the output block distortion compensating circuit is a series circuit in which a resistor and a capacitor are connected in series, and causes the output block bias circuit to have a target output impedance by changing at least one of a resistance of the resistor and a capacitance of the capacitor.

5. A wireless communication apparatus comprising:
a power amplifier recited in claim 1; and
a transmitting antenna for receiving an output signal from the power amplifier, and for outputting the output signal outside.

6. A wireless communication apparatus comprising:
a power amplifier recited in claim 2; and
a transmitting antenna for receiving an output signal from the power amplifier, and for outputting the output signal outside.

7. A wireless communication apparatus comprising:
a power amplifier recited in claim 3; and
a transmitting antenna for receiving an output signal from the power amplifier, and for outputting the output signal outside.

8. A power amplifier comprising:
a plurality of amplifying blocks each of which includes a bipolar transistor,
an output block bias circuit which is connected to a base terminal of an output block bipolar transistor, and which constitutes an output block of the plurality of amplifying blocks,
a preceding block bias circuit which is connected to a base terminal of a preceding block bipolar transistor, and which constitutes an amplifying block followed by the output block,
an output block distortion compensating circuit that causes the output block bias circuit to have a low output impedance so that the output block bipolar transistor has a maximized saturated output power, and
a preceding block distortion compensating circuit that causes the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor, wherein
the preceding block distortion compensating circuit is a series circuit in which a resistor and a capacitor are connected in series, and causes the preceding block bias circuit to have a target output impedance by changing at least one of a resistance of the resistor and a capacitance of the capacitor, and wherein
the preceding block distortion compensating circuit is connected in parallel with a preceding block base ballast resistor connected to the base terminal of the preceding block bipolar transistor.

9. A wireless communication apparatus comprising:
a power amplifier recited claim 8; and
a transmitting antenna for receiving an output signal from the power amplifier, and for outputting the output signal outside.

10. A wireless communication apparatus comprising:
a power amplifier recited in claim 4; and
a transmitting antenna for receiving an output signal from the power amplifier, and for outputting the output signal outside.

11. A power amplifier comprising:
a plurality of amplifying blocks each of which includes a bipolar transistor,
an output block bias circuit which is connected to a base terminal of an output block bipolar transistor, and which constitutes an output block of the plurality of amplifying, blocks,
a preceding block bias circuit which is connected to a base terminal of a preceding block bipolar transistor, and which constitutes an amplifying block followed by the output block,
an output block distortion compensating circuit that causes the output block bias circuit to have a low output impedance so that the output block bipolar transistor has a maximized saturated output power, and
a preceding block distortion compensating circuit that causes the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor, wherein
the output block distortion compensating circuit is a series circuit in which a resistor and a capacitor are connected in series, and causes the output block bias circuit to have a target output impedance by changing at least one of a resistance of the resistor and a capacitance of the capacitor, and
wherein
the output block distortion compensating circuit is connected in parallel with an output block base ballast resistor connected to the base terminal of the output block bipolar transistor.

12. A wireless communication apparatus comprising:
a power amplifier recited in claim 11; and
a transmitting antenna for receiving an output signal from the power amplifier, and for outputting the output signal outside.

13. A method for controlling a power amplifier,
said power amplifier comprising:
a plurality of amplifying blocks each of which includes a bipolar transistor,
an output block bias circuit which is connected to a base terminal of an output block bipolar transistor, and which constitutes an output block of the plurality of amplifying blocks, and
a preceding block bias circuit which is connected to a base terminal of a preceding block bipolar transistor, and which constitutes an amplifying block followed by the output block,
said method comprising the steps of:
causing the output block bias circuit to have a low output impedance so that the output block bipolar transistor has a maximized saturated output power; and
causing the preceding block bias circuit to have an output impedance so that an amplitude distortion of an output power of the power amplifier with respect to an input power is canceled out by (i) a first amplitude distortion characteristic of an output power with respect to an input power of the output block bipolar transistor which has the maximized saturated output power and (ii) a second amplitude distortion characteristic of the preceding block bipolar transistor.

14. The method as set forth in claim 13, wherein:
the preceding block bipolar transistor carries out Class A operation or Class AB operation, and
the output block bipolar transistor carries out Class B operation or Class AB operation.

* * * * *